(12) United States Patent
Thompson et al.

(10) Patent No.: US 7,170,411 B2
(45) Date of Patent: Jan. 30, 2007

(54) METHOD OF AND SYSTEM FOR RAPIDLY LOCATING ALL PASSIVE UNDERGROUND ELECTRONIC MARKER TYPES

(75) Inventors: James W. Thompson, Mineral Wells, TX (US); William C. Wood, Fort Worth, TX (US)

(73) Assignee: Tempo Research Corporation, Vista, CA (US)

( * ) Notice: Subject to any disclaimer, the term of this patent is extended or adjusted under 35 U.S.C. 154(b) by 0 days.

(21) Appl. No.: 10/800,301

(22) Filed: Mar. 11, 2004

(65) Prior Publication Data
US 2004/0183680 A1   Sep. 23, 2004

Related U.S. Application Data

(60) Provisional application No. 60/454,504, filed on Mar. 12, 2003.

(51) Int. Cl.
*G08B 13/14* (2006.01)
(52) U.S. Cl. .............. 340/572.1; 340/568.1; 340/10.1; 340/855.5; 340/5.32
(58) Field of Classification Search ............ 340/572.1, 340/568.1, 572.7, 10.1, 572.4, 551, 568.2, 340/5.32, 309.4, 853.7, 854.2, 854.5, 854.9, 340/855.5
See application file for complete search history.

(56) References Cited

U.S. PATENT DOCUMENTS

| | | | | |
|---|---|---|---|---|
| 4,818,944 A | * | 4/1989 | Rippingale | 324/326 |
| 5,056,454 A | * | 10/1991 | Turner | 116/209 |
| 5,430,379 A | * | 7/1995 | Parkinson et al. | 324/329 |
| 5,644,237 A | * | 7/1997 | Eslambolchi et al. | 324/326 |
| 5,699,048 A |  | 12/1997 | Galloway | 340/572 |
| 5,844,405 A | * | 12/1998 | Eslambolchi et al. | 324/67 |
| 6,097,293 A |  | 8/2000 | Galloway et al. | 340/572.8 |
| 6,356,082 B1 | * | 3/2002 | Alkire et al. | 324/326 |
| 6,377,203 B1 | * | 4/2002 | Doany | 342/44 |
| 6,380,857 B1 |  | 4/2002 | Galloway et al. | 340/572.8 |
| 6,388,575 B1 | * | 5/2002 | Galloway | 340/572.1 |
| 6,954,072 B1 | * | 10/2005 | Schlapp et al. | 324/329 |

* cited by examiner

*Primary Examiner*—Daniel Wu
*Assistant Examiner*—Daniel Previl
(74) *Attorney, Agent, or Firm*—Pillsbury Winthrop Shaw Pittman LLP

(57) ABSTRACT

A method of and system for rapidly locating all passive underground electronic marker types in an area under survey may locate various marker types simultaneously. In accordance with one aspect of the present invention, a marker locator may sequentially transmit and receive multiple frequencies very quickly; alternatively, the transmitter may transmit a broadband signal on multiple frequencies.

9 Claims, 5 Drawing Sheets

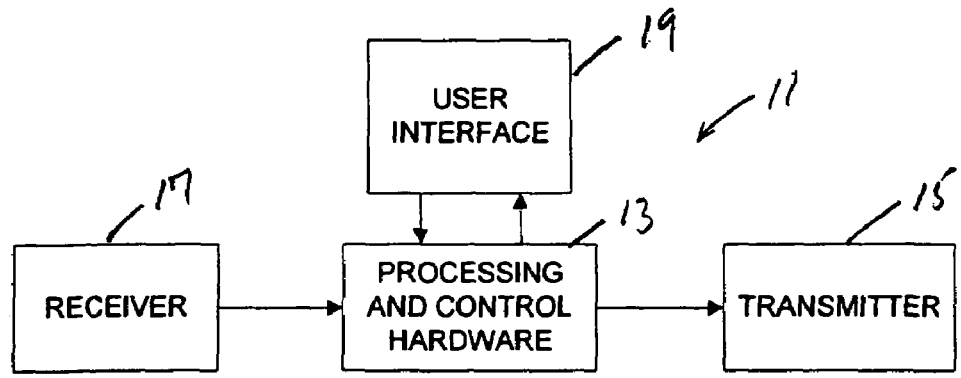
FIG. 1
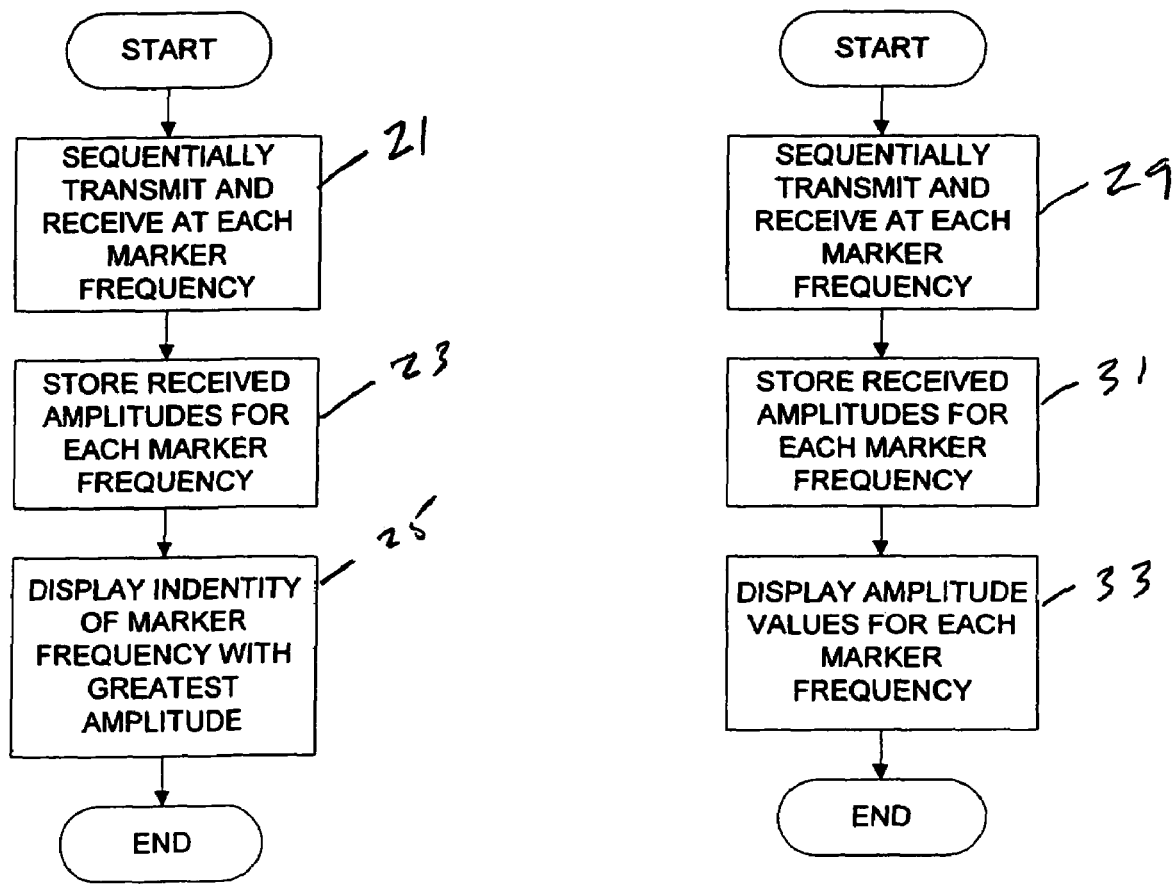
FIG. 2
FIG. 3

METHOD OF AND SYSTEM FOR RAPIDLY LOCATING ALL PASSIVE UNDERGROUND ELECTRONIC MARKER TYPES

CROSS-REFERENCE TO RELATED APPLICATIONS

The present application claims the benefit of U.S. provisional application Ser. No. 60/454,504, filed Mar. 12, 2003, entitled "METHOD OF AND SYSTEM FOR RAPIDLY LOCATING ALL PASSIVE UNDERGROUND ELECTRONIC MARKER TYPES," the disclosure of which is incorporated herein by reference in its entirety.

FIELD OF THE INVENTION

Aspects of the present invention relate generally to the field of locating passive underground electronic markers, and more particularly to a method of and system for rapidly locating all passive underground electronic marker types in an area under survey.

BACKGROUND OF THE INVENTION

The locations of underground utilities such as power, water, sanitary, telephone, gas, cable television (CATV), and non-potable may be marked with devices known as passive underground electronic markers. Typically, each marker contains one or more Inductor-Capacitor (LC) circuits, or equivalent circuitry, each of which is tuned to a unique frequency associated with a particular utility type. In that regard, each circuit typically includes a coil of wire that responds to reception of a signal transmitted at a particular frequency. The markers are buried in a trench with the utility structure to be located during surveying, maintenance operations, or other activities requiring precise location of the utility.

In order to locate a buried marker, an operator moves across the surface of the ground with a locator, which typically includes both a transmitter and a receiver. The transmitter sends out an electromagnetic signal tuned to the unique frequency of the marker associated with a particular utility type. Upon receiving the transmitted signal, the marker resonates and thus produces an electromagnetic response to the transmitted signal. This response is received by the receiver and converted to a signal that is detectable by the operator. The operator may mark the pinpointed location on the ground using chalk, paint, or other surface marking indicia, and then move on to find the next marker buried along the utility structure. Examples of passive marker and locator systems are disclosed U.S. Pat. Nos. 5,699,048, 6,097,293, 6,380,857 and 6,388,575, the disclosures of which are incorporated herein by reference.

A common problem associated with conventional utility marker location technologies arises due to the fact that, often, more than one utility type will be in the same vicinity. Close proximity of various utility types generally requires that the location process be repeated at the respective unique frequency for each respective marker type. Conventional marker locators are typically designed to detect only one or two marker types. The presence of more than one or two utilities in close proximity will require that the location process be repeated for every marker type.

Conventional locator apparatus that can be configured to locate multiple marker types must, in any event, be switched manually between frequencies appropriate for each respective marker type. If the user is looking for all marker types, the user has to remember which frequencies have been checked and which frequencies remain untested. The manual switching between marker types introduces the possibility of user error, and allows marker types to be skipped or forgotten. Specifically, because the search pattern has to be repeated for each marker type, a possibility always exists that the operator will become complacent and not search for each type thoroughly.

SUMMARY

Embodiments of the present invention provide a locator that appears to detect all passive electronic marker types simultaneously. A system constructed in accordance with the present disclosure may generally include a transmitter, a receiver, processing and control hardware, and a user interface. The transmitter transmits RF (or other appropriate) signals and the receiver receives RF (or other appropriate) signals returned by the markers. The processing and control hardware controls the operation of the transmitter and receiver, and additionally processes signals received by the receiver. The user interface provides user input to the processing and control hardware, and further displays information from the processing and control hardware to the user.

In accordance with one aspect of the present invention, the locator may sequentially transmit and receive each frequency very quickly. If the sequential detection is fast enough that the user cannot differentiate that each frequency is being discretely tested, it can be considered simultaneous for all practical purposes. The locator may sample the various marker types many hundreds or thousands of times per second, process the data, and determine if one or more marker types are present. The data may be processed by a digital signal processor (DSP) or microprocessor.

The marker response amplitude at each frequency may stored, for example, for comparison to responses at other marker frequencies. The marker frequency having the greatest response may then determined to be characteristic of the marker type detected; this marker type may be displayed by the user interface as having been detected. In some embodiments, only the marker type having the greatest response is displayed to the user. Alternatively, instead of determining that only one type of marker is present and displaying the greatest indication to the user, the system may display detected responses at each marker frequency. The user then can determine which type or types of markers are being detected. This alternative embodiment may have particular utility in situations where multiple markers types are buried in very close proximity.

In accordance with another aspect of the present invention, the transmitter may transmit a broadband signal on multiple frequencies. With functionality provided by processing and control hardware and software, for example, it is possible to process the response from markers at multiple frequencies. Such processing may be as simple as determining the response at each frequency; processing may also be accomplished by a FFT (Fast Fourier Transform), a Bessel function, or some other method suitable for determining the frequency response at all marker frequencies and for plotting one or more signal response curves.

BRIEF DESCRIPTION OF THE DRAWINGS

FIG. 1 is a simplified block diagram illustrating components of a system constructed in accordance with one embodiment of the present invention.

FIG. 2 is a flowchart illustrating the general operation of one embodiment of a marker location method.

FIG. 3 is a flowchart illustrating the general operation of a second embodiment of a marker location method.

DETAILED DESCRIPTION

Figure 4:
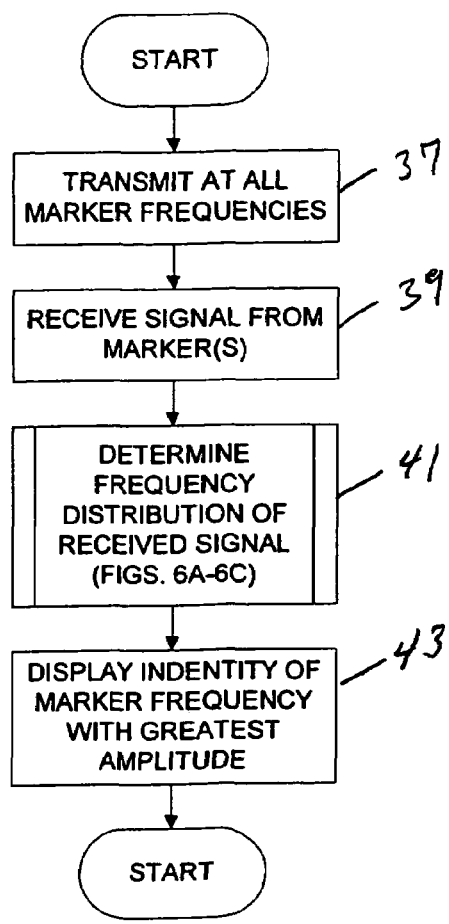
FIG. 4 is a flowchart illustrating the general operation of a third embodiment of a marker location method.

Referring now to the drawings and first to FIG. 1, one embodiment of a system according to the present disclosure is designated generally by reference numeral 11. System 11 may include processing and control hardware 13, which generally includes a microprocessor, digital storage, and other processing and control components that may vary in accordance with system requirements or desired functionality. Processing and control hardware 13 may control a transmitter 15 and a receiver 17.

Transmitter 15 may be configured to transmit on any of several selected frequencies under control of processing and control hardware 13; it will be appreciated that, while radio frequency (RF) signals are one form of signal provided by transmitter 15, other signals from various portions of the electromagnetic spectrum (such as microwave signals, for example) may be used in some applications. Processing and control hardware 13 may receive signals from receiver 17. As noted above with reference to transmitter 15, receiver 17 may be configured and operative to receive signals having frequencies in selected portions of the electromagnetic spectrum, such as RF or microwave signals. The operative frequencies or frequency ranges for transmitter 15 and receiver 17 may be influenced by the type of marker technology employed, for example.

A user interface, indicated generally at 19, may be electrically connected or coupled to processing and control hardware 13. User interface 19 may include user input devices, such as keypads, keyboards, or various pointing devices, for example, allowing user input of data, commands, or instructions to processing and control hardware 13. In some embodiments, user interface 19 also includes display hardware, such as a display screen, for displaying information to a user. It will be appreciated that input and output functionality of user interface 19 may be combined, for example, in a touch-sensitive display screen or other multi-function input/output apparatus.

In some embodiments, system 11 may be implemented as a unitary or integrated portable device that may be carried, rolled, or otherwise moved by a user.

Referring now to FIG. 2, there is illustrated a simplified flowchart depicting the operation of one exemplary embodiment of a marker location method. As indicated at block 21, processing and control hardware may operate transmitter 15 and receiver 17 to transmit and receive, respectively, sequentially at each marker frequency. As indicated at block 23, processing and control hardware 13 may determine and store the amplitude of the return signal received by receiver 17 at each marker frequency. Then, as indicated at block 25, the locator may display the identity of the marker frequency providing a return signal having the greatest amplitude.

Figure 8:
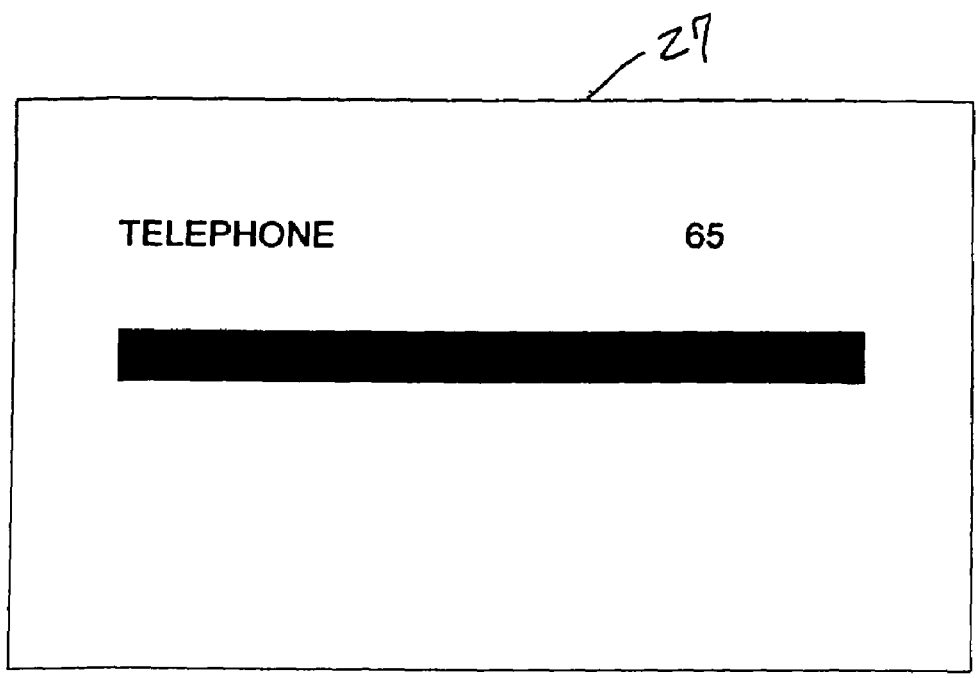
FIG. 8 is a pictorial view of an alternative display.

An example of a display according to the FIG. 2 embodiment is illustrated in FIG. 8, in which a display screen is generally indicated at 27. Display screen 27 displays the identity of the marker frequency having the greatest amplitude, which in the example of FIG. 8 is associated with the TELEPHONE utility marker. As shown in FIG. 8, display screen 27 may provide a numerical indication, a graphical or iconic indication, or some other type of indication representative of the amplitude of the TELEPHONE (or other utility) marker response. The present disclosure is not intended to be limited by the type of indication presented on display screen 27.

Referring now to FIG. 3, there is illustrated a flowchart depicting the general operation of a second embodiment of a marker location method. FIG. 3 processing is similar to the processing described above with reference to FIG. 2, except that the display operation at block 33 displays an amplitude value for each detected marker frequency. Thus, as indicated at block 29, processing and control hardware may operate transmitter 15 and receiver 17 to transmit and receive, respectively, sequentially at each marker frequency. As indicated at block 31, processing and control hardware 13 may determine and store the amplitude of the return signal received by receiver 17 at each marker frequency. Then, as indicated at block 33, the locator may display the amplitude values for each marker frequency.

Figure 7:
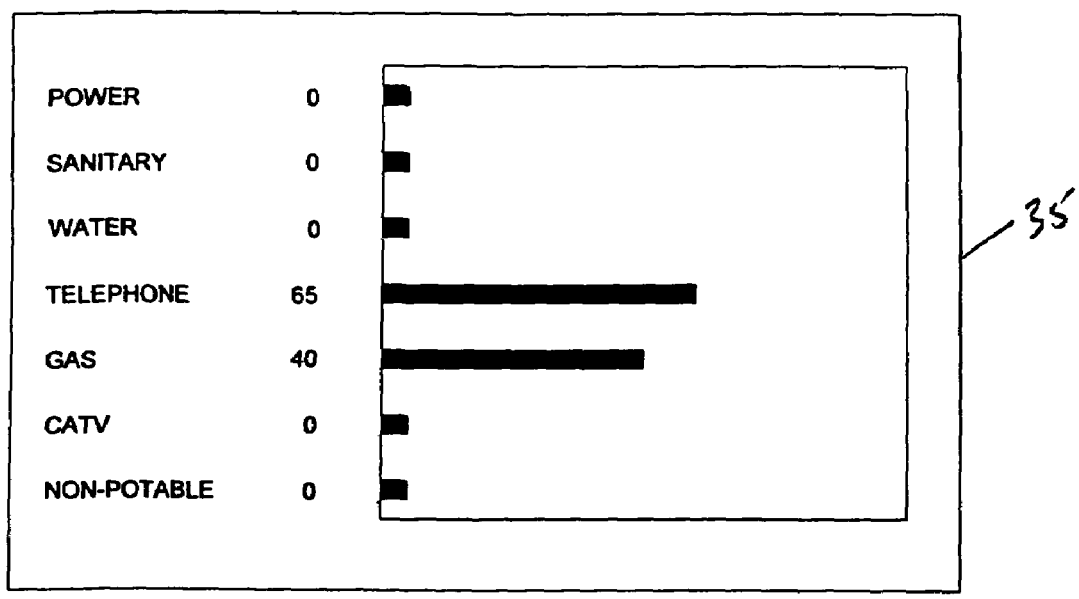
FIG. 7 is a pictorial view of a display.

An example of a display according to the FIG. 3 embodiment is illustrated in FIG. 7, in which a display screen is generally indicated at 35. The exemplary display screen 35 displays numerical and graphical indications of the amplitude value for each marker type. In the example of FIG. 7, the TELEPHONE marker has returned a signal having the highest amplitude value. However, the GAS marker also has returned a signal having a substantial amplitude value relative to the other marker types. Accordingly, observation of display screen 35 indicates that a telephone utility marker and a gas utility marker are in close proximity to each other.

Referring now to FIG. 4, there is illustrated a flowchart depicting the general operation of a third embodiment of a marker location method. As indicated at block 37, transmitter 15 may transmit simultaneously at all marker frequencies. As indicated at block 39, receiver 17 may receive a signal returned from one or more markers. As indicated generally at block 41, processing and control hardware 13 may determine a frequency distribution of the received signal. As set forth below, various frequency distribution determination processes are described in detail with respect to FIGS. 6A–6C. After determining the frequency distribution of the received signal, processing and control hardware 13 may operate the display to display the identity of the marker type with the greatest amplitude, as indicated at block 43. An example of a display according to FIG. 4 processing is illustrated in FIG. 8.

Figure 6A:
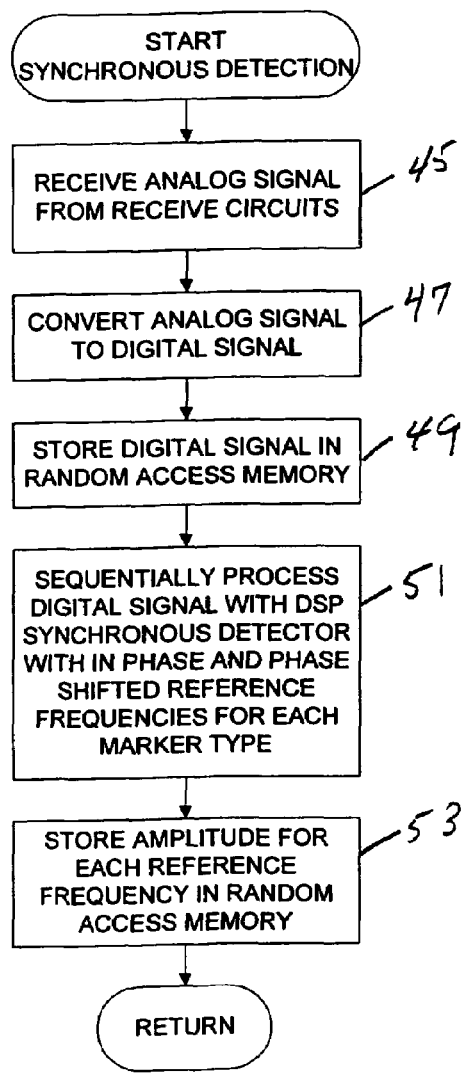
FIG. 6A is a flowchart of a synchronous detection process for determining a response frequency distribution.

Referring now to FIG. 6A there is illustrated a synchronous detection process for determining a response frequency distribution. Processing and control hardware 13 may receive an analog signal from the receive circuits of receiver 17, as indicated at block 45. The system may then convert the analog signal to a digital signal at block 47. The digital signal may be stored, for example, in random access memory or on some other type of data storage medium, as indicated at block 49. Then the system may sequentially process the digital signal, for instance, using a digital signal processor (DSP) synchronous detector, as indicated at block 51. In the exemplary FIG. 6A embodiment, the DSP synchronous detector processes the stored digital signal with in-phase and phase-shifted frequency references for each marker type. Synchronous detection methodologies are generally known to those skilled in the art. The DSP synchronous detector may produce an amplitude value for each reference frequency; an amplitude value for each reference frequency may be stored, such as in random access memory, as indicated at block 53. The data stored at block 53 may be returned to FIG. 4 for additional processing.

Figure 6B:
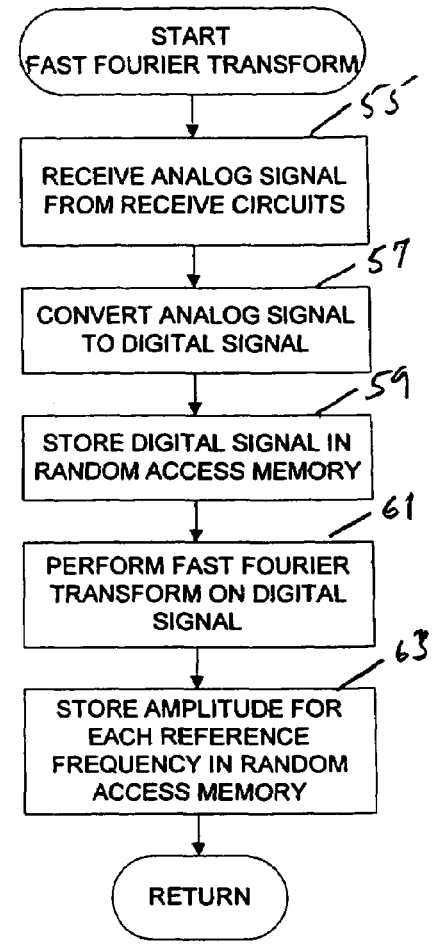
FIG. 6B is a flowchart of a Fast Fourier Transform process for determining a response frequency distribution.

Referring now to FIG. 6B, there is illustrated a flowchart depicting a Fast Fourier Transform (FFT) process for determining a response frequency distribution. The system may receive an analog signal at block 55. The analog signal may be converted to a digital signal (block 57) which may then be stored, for example, in random access memory (block 59). The system may then perform a Fast Fourier Transform on the digital signal as indicated at block 61. As is well known to those skilled in the art, the Fast Fourier Transform converts the digital signal from the time domain to the frequency domain. The system may ascertain and store an amplitude value for each reference frequency determined by the Fast Fourier Transform in random access memory as indicated at block 63. Data stored at block 63 may be returned to FIG. 4 for additional processing. As indicated above, other functions, such as Bessel functions, for example, may provide similar utility as the FFT described above.

Figure 6C:
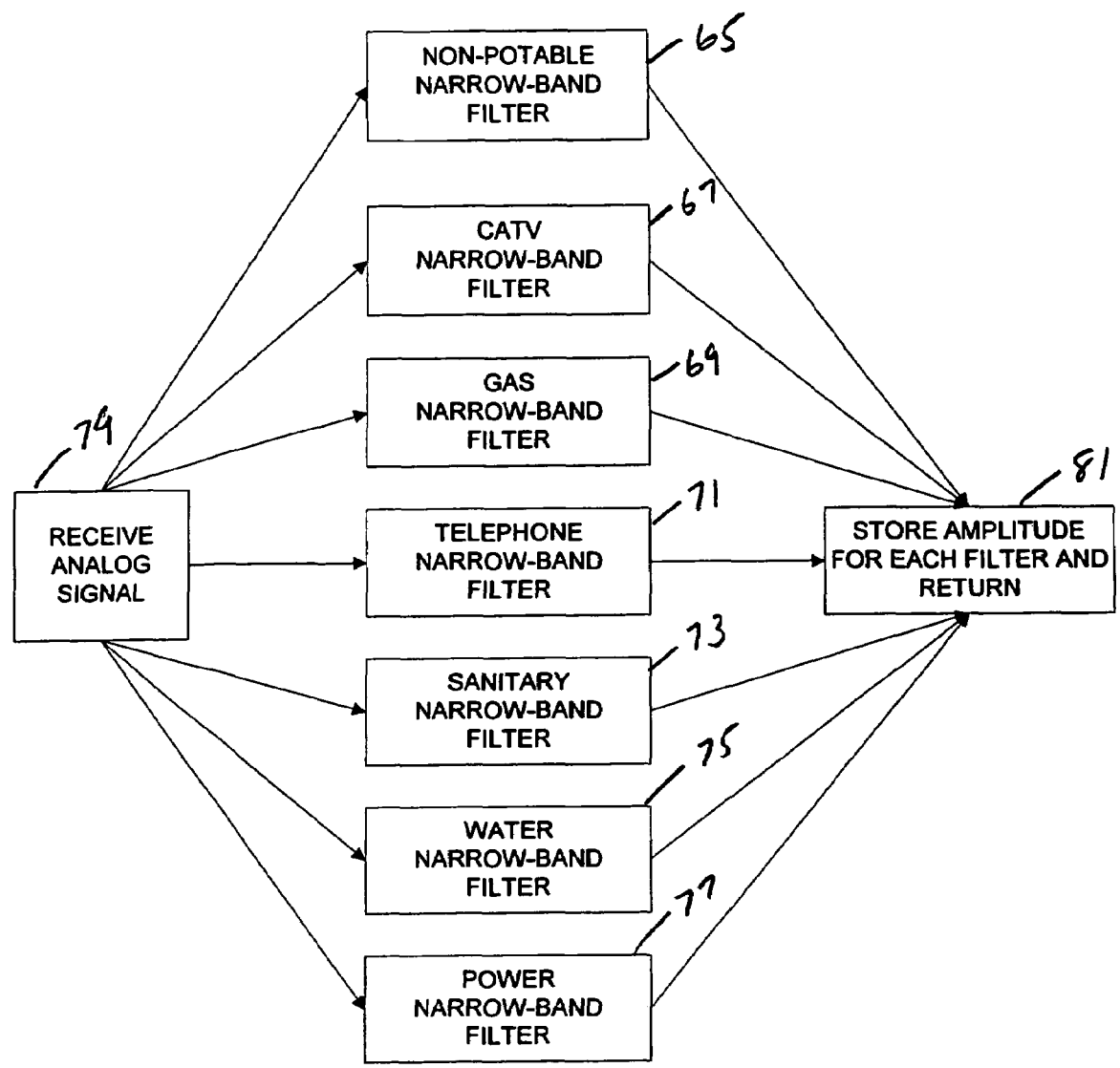
FIG. 6C is a block diagram of a multiple filter process for determining a response frequency distribution.

Referring now to FIG. 6C, there is illustrated a multiple filter process for determining a response frequency distribution. The system may include a non-potable narrow-band filter 65, a CATV narrow-band filter 67, a gas narrow-band filter 69, a telephone narrow-band filter 71, a sanitary narrow-band filter 73, a water narrow-band filter 75, and a power narrow-band filter 77. Each narrow-band filter 65–77 includes circuitry for passing a narrow-band of frequencies at or near a reference frequency for its associated respective marker type. It will be appreciated that the number and arrangement of filters 65–77 may vary, for instance, depending upon the types of markers a particular locator is intended to locate, overall flexibility desired, and other factors.

The system may receive an analog signal from receiver 17, indicated generally at block 79, substantially as set forth in detail above. In the exemplary embodiment, the received analog signal may be passed, in parallel, through each of narrow-band filters 65–77. The amplitude of the signal through each filter may be received as indicated at block 81. The amplitude values received at block 81 may then be returned to FIG. 4 for additional processing.

Figure 5:
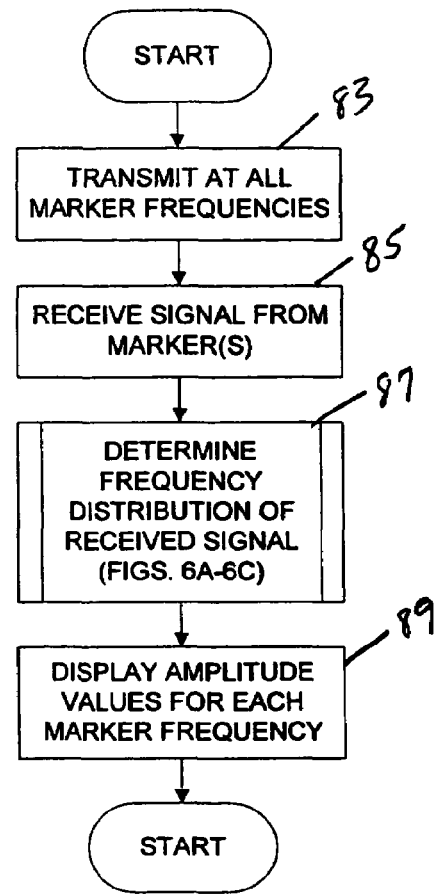
FIG. 5 is a flowchart illustrating the general operation of a fourth embodiment of a marker location method.

Referring now to FIG. 5, there is illustrated a flowchart depicting the general operation of a fourth embodiment of a marker location method. Operation of the FIG. 5 embodiment is similar to that set forth above with reference to FIG. 4, except that an amplitude value for each marker frequency may be displayed as indicated at block 89. Thus, as indicated at block 83, transmitter 15 may transmit simultaneously at all marker frequencies. As indicated at block 85, receiver 17 may receive a return signal from one or more markers. As indicated generally at block 87, processing and control hardware 13 may determine a frequency distribution of the received signal; as set forth above, various frequency distribution determination processes are described with specific reference to FIGS. 6A–6C. After determining the frequency distribution of the received signal, processing and control hardware 13 may operate the display to display an amplitude value for each marker frequency as indicated at block 89. An example of a display according to FIG. 5 processing is illustrated in FIG. 7.

Aspects of the present invention have been illustrated and described in detail with reference to particular embodiments by way of example only, and not by way of limitation. It will be appreciated that various modifications and alterations may be made to the exemplary embodiments without departing from the scope and contemplation of the present disclosure. It is intended, therefore, that the invention be considered as limited only by the scope of the appended claims

What is claimed is:

1. A method of locating multiple passive electronic marker types, said method comprising:
   simultaneously transmitting a signal at each of a plurality of frequencies;
   simultaneously receiving a signal from each of a plurality of markers; and
   determining a marker type for each of the plurality of markers based upon said receiving, wherein said determining a marker type includes determining a frequency distribution of each received signal, and each received signal is passed in parallel through each of a plurality of narrow-band filters.

2. The method as claimed in claim 1, further including displaying the identity of a located marker responsive to said determining.

3. The method as claimed in claim 1, further including displaying a received signal strength for all marker types.

4. A method of locating multiple passive electronic marker types; said method comprising:
   simultaneously transmitting at each of a plurality of marker type frequencies;
   simultaneously receiving a plurality of signals at a plurality of marker type frequencies; and
   determining an amplitude value for each marker type frequency received responsive to said simultaneous transmitting and receiving, wherein said determining an amplitude value includes determining a frequency distribution of each received signal of the plurality of signals, each received signal of the plurality of received signals being passed in parallel through each of a plurality of narrow-band filters.

5. The method as claimed in claim 4, further including displaying a marker type associated with the greatest amplitude value responsive to said determining.

6. The method as claimed in claim 4, including displaying an amplitude value for each marker type.

7. A method of locating multiple passive electronic marker types, said method comprising:
   simultaneously transmitting a signal at each of a plurality of frequencies;
   simultaneously receiving a signal from each of a plurality of markers; and
   determining a marker type for each of the plurality of markers based upon said receiving, wherein said determining a marker type includes determining a frequency distribution of a received signal, the received signal from each of the plurality of markers is passed in parallel through each of a plurality of narrow-band filters, and each of the plurality of narrow-band filters is selected from a group consisting of a non-potable narrow-band filter, a CATV narrow-band filter, a sanitary narrow-band filter, a water narrow-band filter, and a gas narrow-band filter.

8. The method as claimed in claim 7, further comprising displaying a marker type associated with the greatest amplitude value responsive to said determining.

9. The method as claimed in claim 7, including displaying an amplitude value for each marker type.

* * * * *